(12) United States Patent
Lozon et al.

(10) Patent No.: US 8,917,512 B2
(45) Date of Patent: *Dec. 23, 2014

(54) DATA CENTER EQUIPMENT CABINET INFORMATION CENTER

(71) Applicant: Methode Electronics, Inc., Chicago, IL (US)

(72) Inventors: Larry Lozon, Richardson, TX (US); Tim Hazzard, Allen, TX (US)

(73) Assignee: Methode Electronics, Inc., Chicago, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/954,473

(22) Filed: Jul. 30, 2013

(65) Prior Publication Data

US 2014/0029198 A1   Jan. 30, 2014

Related U.S. Application Data

(60) Provisional application No. 61/694,984, filed on Aug. 30, 2012, provisional application No. 61/677,299, filed on Jul. 30, 2012.

(51) Int. Cl.
| | | |
|---|---|---|
| *H05K 5/00* | (2006.01) | |
| *H05K 7/14* | (2006.01) | |
| *G06F 1/16* | (2006.01) | |
| *H05K 7/16* | (2006.01) | |
| *H02B 1/20* | (2006.01) | |
| *A47F 5/08* | (2006.01) | |
| *A47B 81/00* | (2006.01) | |
| *A47B 97/00* | (2006.01) | |

(52) U.S. Cl.
CPC ............... *H05K 7/1498* (2013.01); *G06F 1/16* (2013.01)

USPC ........... 361/724; 361/726; 361/727; 361/826; 211/153; 312/223.2

(58) Field of Classification Search
USPC ......... 361/724, 725, 726, 727, 826, 827, 828; 174/17.05, 72 C; 211/153; 312/223.1, 312/223.2; 340/12.51, 13.26
See application file for complete search history.

(56) References Cited

U.S. PATENT DOCUMENTS

| 7,719,835 | B1 | 5/2010 | Schluter | |
| 8,570,169 | B2 * | 10/2013 | Green et al. | 340/540 |
| 2004/0113786 | A1 | 6/2004 | Maloney | |
| 2010/0106626 | A1 * | 4/2010 | Ashrafzadeh et al. | 705/29 |
| 2012/0044054 | A1 * | 2/2012 | Hussain et al. | 340/10.1 |
| 2012/0113592 | A1 | 5/2012 | Chen | |
| 2012/0166693 | A1 | 6/2012 | Weinstock et al. | |
| 2013/0159039 | A1 | 6/2013 | Brech et al. | |
| 2013/0227136 | A1 | 8/2013 | Sturgeon et al. | |

OTHER PUBLICATIONS http://www.jollytech.com/products/asset-track/index.php; Asset Tracking Software; Jan. 26, 2013.

* cited by examiner

*Primary Examiner* — Hoa C Nguyen
*Assistant Examiner* — Binh Tran
(74) *Attorney, Agent, or Firm* — Loeb & Loeb LLP

(57) ABSTRACT

The cabinet information center integrates an array of electronic sensors and controls to both standard and purpose built data center equipment cabinets to improve operational efficiencies, reduce costs and protect assets typically installed within standard equipment cabinets utilized in data centers by providing a common point of information display and cabinet interaction without the need to physically access assets and vital sensory components internal to the equipment cabinet itself. Equipment can include any standard rack mount devices such as servers, storage arrays and networking devices.

20 Claims, 3 Drawing Sheets

DATA CENTER EQUIPMENT CABINET INFORMATION CENTER

REFERENCE TO RELATED APPLICATIONS

The present application claims the benefit of U.S. Provisional Patent Application Nos. 61/677,299, filed Jul. 30, 2012, and 61/694,984, filed Aug. 30, 2012, whose disclosures are hereby incorporated by reference in their entireties into the present disclosure.

FIELD OF THE INVENTION

The present invention is directed to data center infrastructure management (DCIM) and more particularly to a cabinet information center (CIC) that provides a unified view for such management.

DESCRIPTION OF RELATED ART

Data center infrastructure management (DCIM) refers to the integration of information technology (IT) and facility management to centralize the monitoring and management of a data center's data computing systems. Generally, DCIM is achieved using specialized software, hardware, and sensors to enable a common, real-time monitoring and management platform for a variety of data computing systems.

Conventional server enclosures for connecting and managing one or more electronic server components include a frame or cabinet, such as an extruded aluminum frame, having a plurality of universal mounting rails for receiving the server components. The server cabinet may also include a door made using a variety of materials or venting options to allow for increased airflow to cool interior server components.

In addition to the cabinet itself, many conventional server enclosures include specialized subsystems for providing additional monitoring or control for various conditions that may affect the servers located within the enclosure. For example, these subsystems may include asset management for tracking whether a server component is located within the enclosure, access control for preventing unwanted physical intrusion or tampering with the components within the enclosure, environmental monitoring for maintaining desired operational temperatures, and power management for managing power distribution to components in the enclosure.

One disadvantage associated with conventional enclosures is that none of them provide an integrated enclosure that consolidates all of these functionalities in a way that eases integration and configuration of the enclosure within an IT infrastructure. For example, locks can be electronic or keyed and are either standalone or networked-proprietary, but do not communicate with other systems. Environmental installations are also often a separate solution from the other automation components in the enclosure. Power monitoring, control, and reporting are typically performed through on-board intelligence located within the power distribution units themselves.

Another disadvantage associated with conventional enclosures is that none provide a single network connection to manage these functions. Because each subsystem is typically managed using a separate network connection, a fully loaded enclosure may require many network connections (e.g., IP addresses, Ethernet cables, network ports). These extra network connections associated with conventional un-consolidated enclosures lead to added time and expense required to implement and manage such systems.

Two types of DCIM offerings now exist in the market. The first is software suites that integrate multiple functions. The second is point solutions, which are focused on individual functions. However, a solution that is integrated at the hardware level is lacking. Data center command center/control center consoles can obtain some information about data center conditions but typically cannot ascertain in-rack information.

None of the conventional devices described above provide an integrated DCIM equipment cabinet that consolidates a variety of equipment monitoring and control functions while making the cabinet cheaper and easier to manage by providing a single network connection to the appliance. Instead, conventional devices may only consolidate one or a few types of monitoring or control functions and may provide a separate network connection for each of these functions, thus making conventional cabinets expensive and difficult to manage.

SUMMARY OF THE INVENTION

It is therefore an object of the invention to realize such a solution.

It is another object of the invention to consolidate a variety of equipment monitoring and control functions while making the cabinet easier and less expensive to manage.

It is still another object of the invention to provide the possibility of a single network connection for the variety of equipment monitoring and control functions.

To achieve the above and other objects, the present invention is directed to an integrated data center infrastructure management equipment cabinet appliance. The integrated appliance includes a cabinet frame enclosure for accommodating a plurality of equipment. The integrated appliance also includes at least one functional module selected from a group consisting of: an asset tracking module, an access control module, an environmental management module, and a power management module. The asset tracking module can automatically detect the presence or absence of equipment from the interior space of the cabinet frame enclosure using one or more near-field radio frequency identification (RFID) or other wireless sensors. The access control module provides electronic locking and access control to the interior space of the cabinet frame enclosure. The environmental management module monitors and controls environmental conditions within the interior space of the cabinet frame enclosure. The power management module monitors and controls power distribution to equipment located in the interior space of the cabinet frame enclosure. The integrated appliance also includes a cabinet control module (CCM) that provides consolidated connectivity to the one or more functional modules. In one illustrative embodiment, the CCM presents a single network connection, e.g., a single external Internet Protocol (IP) address, for managing the equipment located in the cabinet frame enclosure.

The data center equipment cabinet appliance (ECA), otherwise known as the cabinet information center (CIC), integrates an array of electronic sensors and controls to both standard and purpose built data center equipment cabinets. The focus of the ECA implementation is to improve operational efficiencies, reduce costs and protect assets typically installed within standard equipment cabinets utilized in data centers by providing a common point of information display and cabinet interaction without the need to physically access assets and vital sensory components internal to the equipment cabinet itself. Equipment can include any standard rack mount devices such as servers, storage arrays and networking devices.

The ECA is a DCIM implementation focused on providing an interactive interface for monitoring and/or controlling environmental (temperature, pressure, airflow, humidity), power (powerstrip/distribution unit) monitoring and control, asset tracking via automated in-cabinet detection, access management through a range of on-screen or other authentication mechanisms to electronic locks, and image based camera surveillance for identification and event logging. ECA cabinets can also include on cabinet display and touchscreen/keyboard interaction for at cabinet interrogation and interaction.

The ECA touchscreen display is integrated with the equipment cabinet's door design and provides ease of visual display to the aforementioned ECA sensor functions as well as touch interaction for information drilling, cabinet access via optional on-screen keypad authentication, and optional keyboard-video-mouse (KVM) interaction for "touch-free" in-cabinet asset administration. The ECA applies touchscreen and information display technology to data center equipment cabinets. The technology has to date not been applied to the monitoring and interaction with equipment cabinets in data centers.

The ECA controller provides electronic integration with the ECA for video and touch processing offload.

The ECA is driven by a "cabinet control module" (CCM) that consolidates all ECA monitoring and control functions, delivery network connectivity for the ECA automation through a single Ethernet or other network connection. The CCM has the unique ability to auto-detect the ECA subcomponents that are connected to it dynamically. This greatly eases integration and configuration. The controller offloads key graphic display and touch control processing from the cabinet control module (CCM).

The CCM is a single unit that provides connectivity for all sensor/control components listed below and delivers single point Ethernet (or any other suitable networking protocol) based network connectivity to the ECA. This single-point consolidation is significant to data center managers, since it provides a single IP address or other network connection to manage a multitude of ECA functions.

The Asset-Track sensor units are installed into the ECA at each equipment mounting location (rack unit or U). The Asset-Track sensor units preferably detect the installation or removal of assets wirelessly, for example, by detecting RFID tags placed on the assets. Other in-rack asset detection implementations exist but require physical connections between sensors and the actual equipment assets being monitored, thereby leading to the possibility of errors in reading accuracy and missing asset installation or removal events. Each asset can have an asset RFID tag attached thereto prior to installation and typically performed as a normal part of equipment delivery and registration.

The Lock-Talk access control components provide electronic locking and access control to the ECA via third-party electronic locks. Access methods available for customer choice include a touch-sensor-based ten-key keypad for PIN access and door unit selection, a proximity card reader for use of key fob or keycard access, on-screen touchscreen control, remote network control, and/or biometric access. Lock-Talk also optionally integrates image based controls via camera still and video technologies.

Enviro-Track provides sensing of temperature, humidity, airflow, and air pressure for the ECA in order to assess its environmental conditions. In appropriately equipped ECA cabinets, Enviro-Track can also control airflow fan speeds and cabinet mounted cooling components. Environmental sensor functions via Enviro-Track are traditional and expected in accordance with industry ASHRAE standards. Unique control of cabinet mounted fans and cooling systems along with the unique integration of the environmental components with the rest of the appliance functions.

Power-Talk provides sensing, reporting and control over power elements supplied to the CA via power distribution units (PDUs), powerstrips, and intelligent power battery backup devices. Power-Talk integrates intelligent PDU functions for monitoring and selective control of power-strip outlets and battery control for backup or selective power increases. Power-Talk is a unique solution traditionally performed on-board intelligent power distribution units or intelligent powerstrips. By using Power-Talk, a multitude of 3rd party PDU components can be controlled and leveraged via the single Ethernet connection versus taking up an additional network connection in the datacenter.

The ECA Information Center includes a touchscreen and information display that provides external cabinet interaction to the above ECA information and control functions.

Each of the above elements is modular and customizable as packages depending on customer requirements. As elements are added to the ECA implementation, the CCM auto-discovers the ECA functions that it can manage.

Each package in the ECA distinctly manages its particular discipline; e.g., Lock-Talk is focused on authentication and access while Asset-Track is focused on asset tracking. The uniqueness to the approach is delivered via correlated automation scenarios as follows:

Authentication to access inside the cabinet may be granted to only those who are authorized to access the specific assets contained in the cabinet.

Temperature variance or other environmental factors may lead to the need to unlock and open the doors for additional airflow.

Certain assets identified via Asset-Track may have specific power ramp up profiles based on workload that may need to be coordinated with Power-Talk.

Asset locations, power profiles at the asset locations planned along with environmental profiles can be analyzed for efficiency optimization.

Each of the packages could make use of alternative components to achieve the same respective functional results.

Asset-Track is unique with respect to its use of nearfield RFID or other wireless technology and corresponding equipment tags. Other asset tracking solutions make use of tethered sensors or embedded sensors in power cables to sense the presence of assets. They could be substituted for the wireless approach but are deemed inferior in their ability to attest to the asset's presence or absence. This is due to the fact that an asset could be present and simply not tethered to the asset sensor in the first configuration or simply not plugged in where power cables are used with sensors.

Lock-Talk can make use of third-party electronic locks that are configured to interact with the CCM. The associated Lock-Talk authentication mechanisms such as Methode's touch-sensor-based keypad, Southco's integrated lock and proximity reader, and Lumidigm's biometric scanner are integrated and configured to maximize their performance with the CCM. Alternative keypads, proximity readers, and biometric devices could be interfaced to interact with the CCM architecture as well.

Enviro-Track sensors are very common sensor devices that are readily integrated to the CCM sensing and control logic. Method has developed its own cabling and sensing thermistors for the actual measurement of temperature in the solution.

Power-Talk speaks to a range of 3rd party PDU strips for gathering key power performance data. Power-Talks uniquely integrates to a new line of intelligent in-rack battery devices that will be capable of providing dynamic power peaking without the need to supply additional external power.

The ECA package provides real time cabinet sensory and control display and interaction by connecting to the CCM for information query and output to the ECA controller for graphics rendering and touch interaction.

The ECA process is set to poll for status updates on key value intervals in order to update sensor elements such as:
Temperature
Humidity
Airflow
AirPressure
Front and Rear Cabinet Door Lock state
Incoming cabinet power state
Outlet power state
Outlet power control
Power bank control
Power bank state
Asset presence or absence by rack unit state
Asset movement events
Cabinet authentication via on screen keypad
Optional KVM integration for in-cabinet asset administration without the need to physically touch the assets being administered.

Alternatives would include remote access to similar information or large display screen technology utilized in control rooms and command centers. Equipment cabinets from third-party manufacturers may be optimized to integrate the CIC into their cabinet design. The present invention can be used on any type of equipment cabinet commonly used in datacenters, production studios, home theaters, broadcast facilities, etc. Adaptations can be produced to also address medical arenas such as a pharmacy.

The software can be Linux-based for ease of development, lower barrier of entry, and greater compatibility with various database engines. The software can include a Ruby on Rails software engine and a Web interface implemented through Adobe Flash. Integration options for third-party software suites can be provided.

The present invention can be implemented in new cabinet enclosures or retrofitted to existing cabinet enclosures.

BRIEF DESCRIPTION OF THE DRAWINGS

A preferred embodiment of the present invention will be set forth in detail with reference to the drawings, in which.

DETAILED DESCRIPTION OF THE PREFERRED EMBODIMENT

Figure 1:
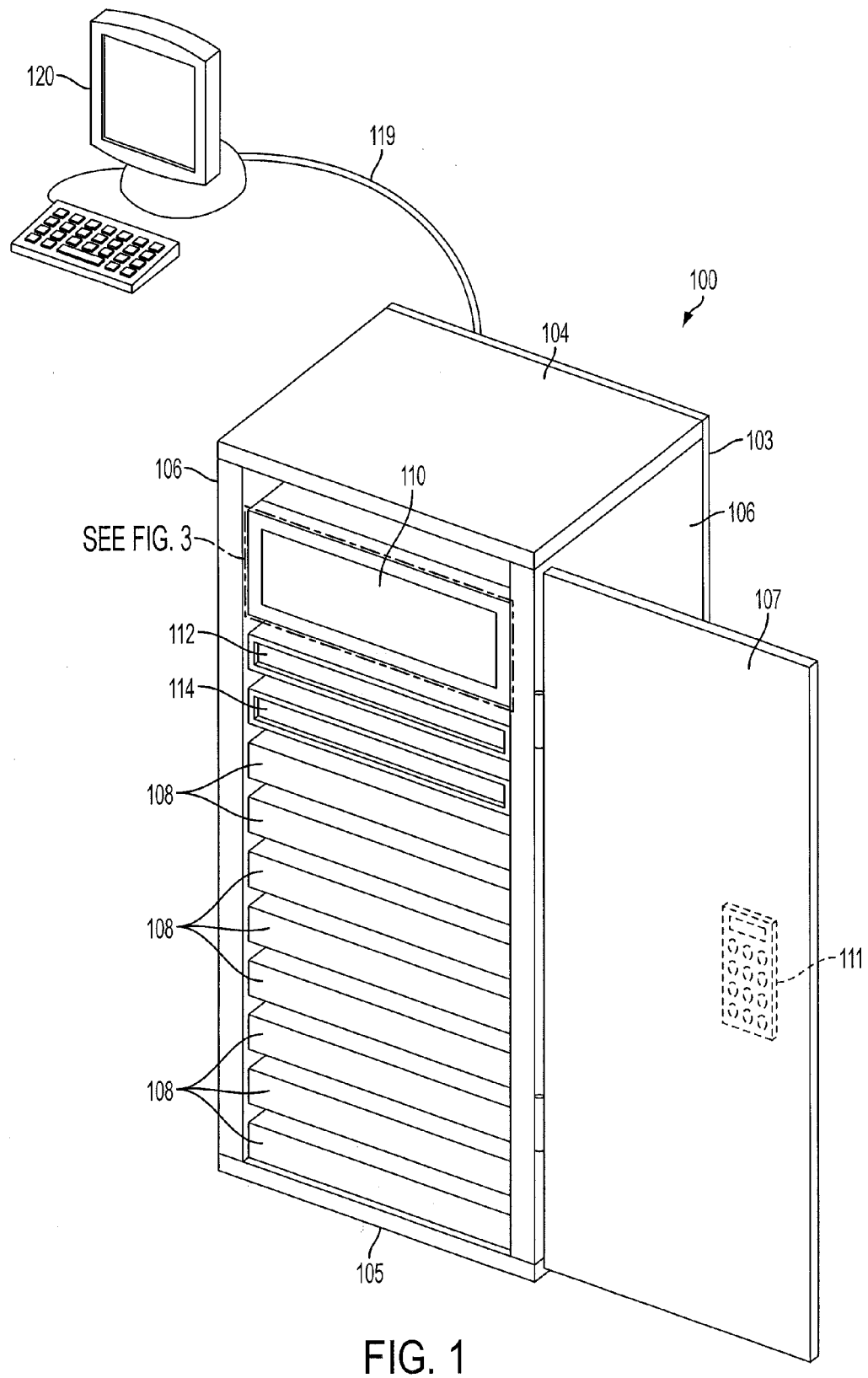
FIG. 1 is a perspective diagram of an exemplary system including an integrated data center infrastructure management equipment cabinet appliance, in accordance with an exemplary embodiment of the present invention.

A preferred embodiment will be set forth in detail with reference to the drawings, in which like reference numerals refer to like elements or steps throughout.

Figure 2:
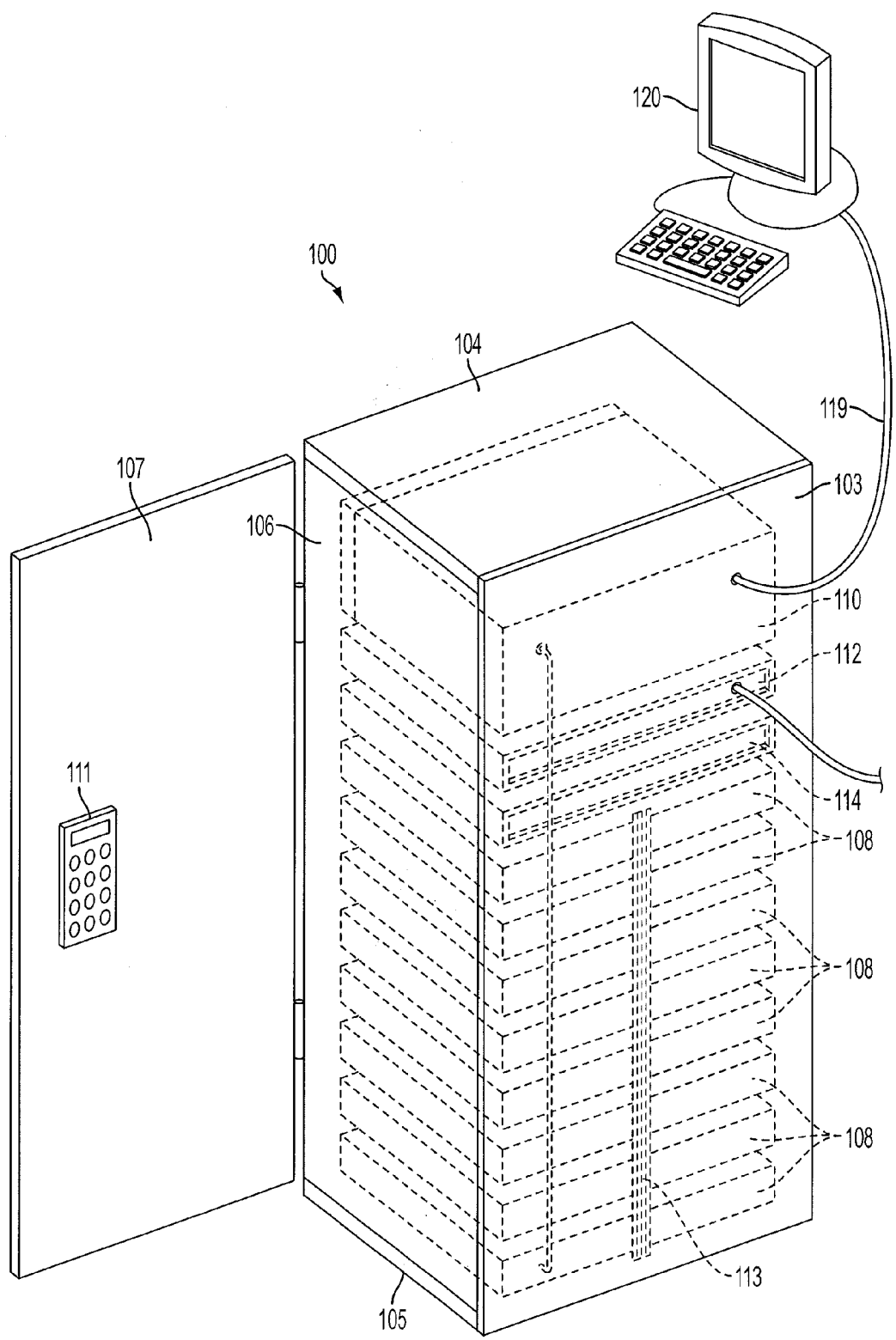
FIG. 2 is a perspective diagram of an exemplary system including an integrated data center infrastructure management equipment cabinet appliance, in accordance with an exemplary embodiment of the present invention.

FIGS. 1 and 2 show an exemplary system including an integrated data center infrastructure management equipment cabinet appliance in accordance with an embodiment of the subject matter described herein. In FIGS. 1 and 2, dashed lines are shown to illustrate components that may not be visible from the given perspective. For example, the equipment cabinet appliance (ECA) 100 includes a completely enclosable/sealable enclosure, and therefore, the front door 107 is shown in an open position in FIG. 1 in order to more clearly illustrate the various internal components of the ECA 100. Because the back panel of the ECA 100 is not removable in the embodiment shown, FIG. 2 provides additional illustration of the components and/or connections which are located inside the ECA 100 and between the back panel of the ECA 100 and the back portions of the various components in the ECA 100.

The ECA 100 includes a cabinet frame 102 for storing, connecting, monitoring, and managing a plurality of servers, such as servers 108. The servers 108 may, for example, be 1 U format server blades configured to perform functions desired by the user. In addition to the servers 108, the ECA 100 includes a cabinet control module (CCM) 110 for managing one or more functional modules 111-114 which provide one of: asset tracking, access control, environmental management, and power management. The functional modules 111-114 are managed using the central, dedicated CCM 110 which provides a single network access connection to the ECA 100. By integrating multiple features provided by the functional modules 111-114 in a single enclosure and managing those features using a single external network connection, the integration and configuration of this DCIM implementation is easier and cheaper than with conventional devices. For the reasons stated above which distinguish the ECA 100 from conventional equipment enclosures, the ECA 100 of the present invention may be referred to as an "appliance" rather than just a rack, cabinet, or enclosure. Additional details of the ECA 100 will now be described in greater detail below.

Cabinet Frame:

The cabinet frame 102 accommodates a plurality of equipment, where the cabinet frame 102 has a top wall 104 and a bottom wall 105 that is located opposite the top wall 104. The cabinet frame enclosure 102 also includes two sidewalls 106 connected between two corresponding opposite sides of the top 104 and the bottom 105 walls and a back wall (not shown) connected between the top 104 and the bottom 105 and the sidewalls 106. Finally, the cabinet frame enclosure 102 includes a front door panel 107 located opposite the back wall (not shown), thereby defining an interior space for accommodating the equipment therein.

It is appreciated that the cabinet frame 102 may include a standardized frame or enclosure for mounting multiple equipment modules, where each module has a front panel that is a standard dimension (e.g., 19 inches wide), and may include edges that protrude on each side to allow for modules to be fastened to the rack frame. Equipment designed to be placed in the cabinet frame 102 may be described as rack-mount, rack-mount instrument, a rack mounted system, a rack mount chassis, subrack, rack mountable, or occasionally simply shelf. The height of the electronic modules may also have standardized dimensions (e.g., as multiples of 1.75 inches or one rack unit or U). An industry-standard rack cabinet may be approximately 42 U-44 U tall. Rack-mountable equipment is traditionally mounted by bolting or clipping its front panel to the rack. Heavy equipment or equipment which is commonly accessed for servicing, for which attaching or detaching at all four corners simultaneously would pose a problem, is often not mounted directly onto the rack but instead is mounted via rails (or slides). A pair of rails is mounted directly onto the rack, and the equipment then slides into the rack along the rails, which support it. When in place, the equipment may also then be bolted to the rack. The rails may also be able to fully support the equipment in a position where it has been slid clear of the rack, which may be useful for inspection or maintenance of equipment which will then be slid back into the rack. Thus, the cabinet frame 102 can be used with any type of equipment commonly used in datacenters, production studios, home theaters, broadcast facilities, etc. Adaptations may be used to address medical applications, such as for a pharmacy, which may have different requirements.

Each of the functional modules 111-114 will now be described in greater detail below. It is appreciated that any combination of one or more of the functional modules 111-114 may be present in the ECA 100 without departing from the scope of the subject matter described herein. Further, the functional modules 111-114 may include multiple components such as sensors, control systems, fans, and associated processors, memory, and software. Thus, the term "module" is not intended to be limited to any specific component(s) illustrated in the exemplary embodiments described below, but rather may refer to any combination of components associated with providing the functionality described.

Access Control Module:

The access control module 111 provides electronic locking and access control to the interior space of the cabinet frame 102. For example, the access control module 111 may include a keypad, a proximity card, biometric pad, or any other suitable means for controlling physical access to the cabinet frame 102. In one embodiment, the access control module 111 provides electronic locking and access control to the ECA 100 via third party electronic locks.

Access methods available for control may be chosen by the user and can include: a touchsensor-based key keypad for pin access and door unit selection, a proximity card reader for use of keyfob or keycard access, an on-screen touchscreen control, a remote network control, and/or biometric access. It is appreciated that the access control module 111 may also optionally integrate image-based controls including those using camera (still and video) technologies. It is further appreciated that the access control module 111 can make use of third party electronic locks that are specifically configured to interact with the CCM 110. These may include certain touchsensor based keypads produced by Methode Inc., certain integrated locks and proximity readers produced by Southco Inc., and certain biometric scanners produced by Lumidigm Inc., each of which have been integrated and configured to maximize their performance with the CCM 110.

Power Management Module:

The power management module 112 monitors and controls power distribution to equipment 108 located in the interior space of the cabinet frame 102. For example, the power management module 112 provides sensing, reporting and control over power elements supplied to the ECA 100 via power distribution units (PDUs), powerstrips, and intelligent power battery backup devices. The power management module 112 may integrate intelligent PDU functions for monitoring and selective control of powerstrip outlets and battery control for backup or selective power increases using on-board intelligent power distribution units or intelligent powerstrips. By using the power management module 112, a multitude of third-party PDU components can be controlled and leveraged via the single Ethernet connection 119 versus taking up an additional network connection in the datacenter. It is appreciated that a range of third party PDU strips may be used for gathering key power performance data. Additionally, the power management module 112 may integrate with intelligent in-rack battery devices capable of providing dynamic power peaking without the need to supply additional external power.

Asset Tracking Module:

The asset tracking module 113 automatically detects the presence or absence of equipment, such as servers 108, from the interior space of the cabinet frame 102 using one or more nearfield radio frequency identification (RFID) sensors. In one embodiment, the asset tracking module 113 may include one or more RFID tags attached to each of the assets 108 to be tracked and a corresponding RFID reader located inside of the cabinet frame 102. More specifically, the RFID reader may include a plurality of individual RFID readers that are connected in series and vertically mounted to the back 103 and/or side walls 106 of the cabinet frame 102, as illustrated in FIG. 2.

In one embodiment, the asset tracking module 113 may be installed in the ECA 100 at each equipment mounting location (rack unit or U). The asset tracking module 113 automatically detects the installation or removal of assets 108 installed within the ECA 100 rack unit locations via nearfield RFID technology. It is appreciated that the asset tracking module 113 is not intended to be limited to a specific implementation or configuration; however, successful detection of the asset tags may require that the distance between the asset tag and the asset reader not exceed a predetermined distance (e.g., 20 mm) Additionally, some parts of the cabinet frame 102, such as those parts located between the nearfield antenna/reader and the asset tag it is attempting to read, may be made of a non-metal material in order to avoid interfering with the wireless communication between the tag and the reader.

It is appreciated that while other conventional in-rack asset detection implementations exist, they often require physical connections to be present between sensors and the assets being monitored, thereby leading to the possibility of errors in reading accuracy and missing asset installation or removal events. Here, each asset only requires an asset RFID tag to be attached to the equipment prior to installation and is typically performed as a normal part of equipment delivery and registration.

Environmental Management Module:

The environmental management module 114 monitors and controls environmental conditions within the interior space of the cabinet frame enclosure. For example, the environmental management module 114 provides sensing of temperature, humidity, airflow, and air pressure for the ECA 100 in order to assess its environmental conditions. In an appropriately equipped ECA cabinet frame 102, the environmental management module 114 can also control airflow fan speeds and cabinet mounted cooling components, such as servers 108, in accordance with industry standards. The sensor devices associated with the environmental management module 114 may be integrated with the CCM 110 sensing and control logic, which will be described in greater detail below with respect to the CCM 110. In one embodiment, the environmental sensors may include specialized cabling and sensing thermistors for performing measurement of temperature.

Cabinet Control Module (CCM):

The cabinet control module (CCM) 110 provides consolidated connectivity to the one or more functional modules 111-114, where the CCM 110 presents a single external network connection 119 (e.g., Internet Protocol (IP) address) for managing the equipment 108 associated with the ECA 100.

The CCM 110 provides a single unit that provides connectivity for all sensor/control components listed below and delivers single point Ethernet based network connectivity to the ECA 100. This single point consolidation is significant to data center managers since it provides a single IP address to manage a multitude of ECA functions 111-114. The CCM 110 is capable of auto-discovering ECA components installed and consolidates all key ECA functions 111-114 to a single Ethernet connection to the external ECA environment, such as connection 119 to computer 120, thereby greatly reducing overall datacenter connectivity costs dedicated to monitoring and control.

Figure 3:
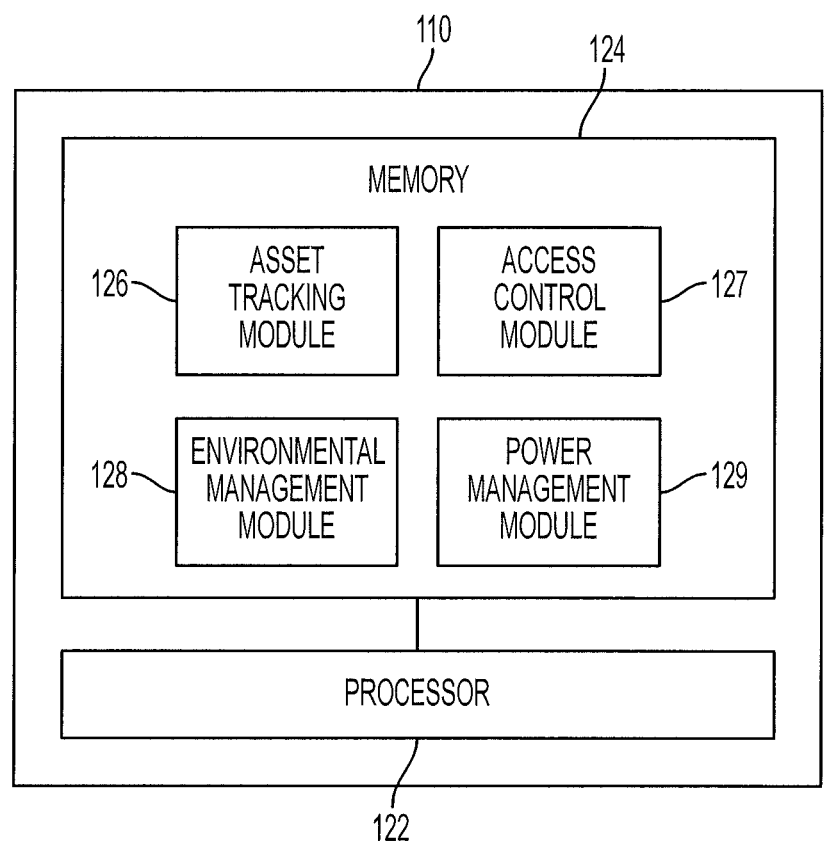
FIG. 3 is a schematic diagram of internal components of an exemplary cabinet control module for use in an integrated data center infrastructure management equipment cabinet appliance, in accordance with an exemplary embodiment of the present invention.

FIG. 3 is a schematic diagram of internal components of an exemplary cabinet control module for use in an integrated data center infrastructure management equipment cabinet appliance, in accordance with an exemplary embodiment of the present invention. Referring to FIG. 3, the CCM 110 includes a processor 122 and a memory 124 containing computer-readable and computer-executable instructions that, when executed by the processor 122, perform steps. The memory 124 includes an asset tracking software module 126, an access control software module 127, an environmental management software module 128, and a power management software module 129.

Each of the software modules 126-129 may be associated with one or more respective physical devices located in the ECA 100, such as sensors, fans, locks, or batteries for performing various monitoring, control, or management functions. For example, the asset tracking software module 126 may be associated with (e.g., communicatively or otherwise connected to) the RFID reader 113 for detecting the corresponding RFID tags located on each of the servers 108. The access control software module 127 may be associated with the access control module 111, which may include a keypad, proximity card reader, biometric access lock etc. The access control software module 127 may record the date and time of each successful or failed access attempt along with the identity of the user. The environmental management software module 128 may be associated with a plurality of environmental sensors and control devices shown for simplicity as environmental module 114. Thus, the environmental management software module 128 may receive environmental data, such as temperature, humidity, airflow, etc., from the sensors of the environmental management module 114. The environmental management software module 128 may also send control signals to one or more environmental control devices, such as fans, dehumidifiers, water pumps, etc., for adjusting one or more of the monitored environmental factors inside the ECA 100. Finally, the power management software module 129 may be associated with the power management module 112, such as power backup batteries, power strips, or other power-related devices. The power management software module 129 can receive data from the power management module 112 for monitoring the power consumption of the servers 108 by receiving data from a power strip, for providing failover battery backup protection from an alternate power source in the event that the primary power source is unavailable by sending a signal to the alternate power source, and for recording and reporting power-related data to computer 120.

Interaction of the Functional Modules:

As described above, the ECA 100 may include a plurality of functional modules 111-114 for providing asset tracking, access control, environmental management, and power management functions. Because each of these functional modules may be consolidated and coordinated using the CCM 110, various usage or automation scenarios may utilize the interdependence of these functional modules to further optimize the performance of the ECA 100. For example, various exemplary correlated automation scenarios are described below, but are not intended to be limiting.

A first correlated automation scenario includes combining access control and asset tracking, where access to the cabinet 102 may be granted only to users who are authorized to access one or more specific assets 108 contained in the cabinet frame 102.

Another correlated automation scenario includes combining environmental management and access control, where a temperature variance or other environmental factor may lead to the need to unlock and open the doors for additional airflow. Thus, access may be granted to the cabinet frame 102 based on an indication generated by the environmental monitoring module 114.

Another correlated automation scenario includes combining asset tracking and power management, where certain assets 108 identified via the asset tracking module 113 may be associated with a specific power ramp up profile based on workload that is coordinated with the power management module 112.

Another correlated automation scenario includes combining information from any or all of the functional modules 111-114 where, for example, the asset locations, power profiles for the assets/asset locations, environmental profiles/conditions for the assets/asset locations, and the access control for the cabinet frame 102 may be analyzed together in order to optimize the overall efficiency or performance of the ECA 100.

Hardware requirements will now be disclosed. While the preferred embodiment has the following server hardware requirements, different implementations can have different requirements, e.g., higher or lower requirements or the use of non-Intel processors. The server should be implemented on a dedicated machine with at least a quad-core Intel Xeon processor with a speed of at least 2.2 GHz, with at least 4 GB RAM and a 1 GB network interface card. Persistent storage should include a 10 k RPM RAID 5, 6, 10 array with at least three hard drives. For each application, add 1 GB RAM; for each two add-on applications, add one CPU core; for every 2,500 assets for 100 locks, add 250 MHz to the processor speed and 10 MB RAM. One server can access 16 SIRIT readers; for each additional SIRIT reader, add 15 MB RAM.

These and other advantages of the present invention will be apparent to those skilled in the art from the foregoing specification. Accordingly, it is to be recognized by those skilled in the art that changes or modifications may be made to the above-described embodiments without departing from the broad inventive concepts of the invention. For example, numerical values are illustrative rather than limiting, as are disclosures of specific standards, technologies, or brands. It is to be understood that this invention is not limited to the particular embodiments described herein, but is intended to include all changes and modifications that are within the scope and spirit of the invention, which should therefore be construed as limited only by the appended claims.

What is claimed is:

1. An integrated data center infrastructure management electronic equipment rack, the integrated rack comprising:
   a rack enclosure defining an interior space for accommodating a plurality of pieces of electronic equipment, the rack having a mounting location for each piece of electronic equipment and the frame having an inside surface and a door extending generally from a top to a bottom of the rack, the door for enclosing each piece of electronic equipment within the interior space;
   a plurality of functional modules selected from a group consisting of:

asset tracking modules for automatically detecting the presence or absence of the electronic equipment from the interior space of the cabinet frame enclosure, each module mounted at a mounting location adjacent each piece of electronic equipment, the modules mounted vertically to the inside surface of the frame;

an access control module for providing electronic locking and access control to the interior space of the cabinet frame enclosure;

an environmental management module for monitoring and controlling environmental conditions within the interior space of the cabinet frame enclosure; and a power management module for monitoring and controlling power distribution to electronic equipment located in the interior space of the cabinet frame enclosure; and a cabinet control module (CCM) for providing consolidated connectivity to the plurality of functional modules, wherein the CCM presents a single network connection for managing the electronic equipment located in the cabinet frame enclosure.

2. The integrated appliance of claim 1, wherein the asset tracking module is configured to detect the electronic equipment wirelessly.

3. The integrated appliance of claim 2, wherein the asset tracking module is configured to detect one or more RFD tags attached to the electronic equipment.

4. The integrated appliance of claim 3, wherein the asset tracking module comprises one or more RFID readers located within the interior space of the cabinet frame enclosure.

5. The integrated appliance of claim 4, wherein the asset tracking module further comprises a plurality of individual asset tracking modules connected in series vertically along the inside surface of the frame.

6. The integrated appliance of claim 1, wherein the access control module comprises one of a touch-sensor-based key keypad, a proximity card reader, an on-screen touch-screen control, a remote network control, and biometric access.

7. The integrated appliance of claim 1, wherein the access control module is configured to use visual data including at least one of still images and video.

8. The integrated appliance of claim 1, wherein the environmental management module includes one of a fan and a dehumidifier for controlling one of airflow and humidity within the interior space of the cabinet frame enclosure.

9. The integrated appliance of claim 1, wherein the power management module comprises one or more of: a power distribution unit (PDU), a power strip having multiple receptacles and each receptacle being monitored to provide power performance data, and an intelligent power battery backup device.

10. The integrated appliance of claim 1, wherein the power management module is configured to selectively control at least one of power delivery and power storage to the electronic equipment.

11. The integrated appliance of claim 1, wherein the cabinet control module is wirelessly connect to the plurality of functional modules.

12. The integrated appliance of claim 1, wherein the cabinet control module is wired to the plurality of functional modules and provides a single IP address for remote communication via the cabinet control module to all functional modules.

13. The integrated appliance of claim 1, wherein the cabinet control module comprises a touch-screen display for providing external user interaction between a user and the integrated appliance.

14. The integrated appliance of claim 1, wherein the cabinet control module is configured to manage a correlated automation scenario where information received from at least a first functional module is used to manage at least a second functional module.

15. The integrated appliance of claim 1, wherein the single network connection has a single IP address.

16. A method for managing an integrated data center infrastructure electronic equipment rack comprising the steps of:
providing a rack enclosure defining an interior space for accommodating a plurality of pieces of electronic equipment, the rack having a mounting location for each piece of electronic equipment and the frame having an inside surface and a door extending generally from a top to a bottom of the rack, the door for enclosing each piece of electronic equipment within the interior space;
automatically testing, by an asset tracking module, for the presence or absence of the electronic equipment located within the interior space of the cabinet frame enclosure, each module mounted at a mounting location adjacent each piece of electronic equipment, the modules mounted vertically to the inside surface of the frame;
controlling locking and access by an access control module for the interior space of the cabinet frame enclosure;
monitoring and controlling, by an environmental management module, for environmental conditions within the interior space of the cabinet frame enclosure; and
monitoring and controlling, by a power management module, for a power distribution unit to electronic equipment located in the interior space of the cabinet frame enclosure; and
consolidating connectivity by a cabinet control module (CCM) for the plurality of functional modules, wherein the CCM presents a single network connection for managing the electronic equipment located within the cabinet frame enclosure.

17. The method of claim 16, further comprising the step of detecting the electronic equipment wirelessly.

18. The method of claim 17, further comprising the step of detecting one or more RFID tags attached to the electronic equipment.

19. The method of claim 18, further comprising the step of mounting one or more RFD readers within the interior space of the cabinet frame mounting enclosure.

20. The method of claim 19, further comprising the steps of connecting in series a plurality of individual asset tracking modules and mounting the asset tracking modules vertically along the inside surface of the frame.

* * * * *